(12) United States Patent
Stringer et al.

(10) Patent No.: US 7,604,451 B2
(45) Date of Patent: Oct. 20, 2009

(54) FEED MECHANISM AND METHOD FOR FEEDING MINUTE ITEMS

(75) Inventors: Timothy Kent Stringer, Bucyrus, KS (US); Simon Scott Yerganian, Lee's Summit, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 1637 days.

(21) Appl. No.: 10/385,122

(22) Filed: Mar. 10, 2003

(65) Prior Publication Data

US 2004/0178046 A1  Sep. 16, 2004

(51) Int. Cl.
*B64F 5/00* (2006.01)

(52) U.S. Cl. .......................... 414/589; 414/782; 221/93; 221/94; 221/95; 156/566; 156/569

(58) Field of Classification Search ................. 414/589, 414/782; 221/93–95; 156/566, 569
See application file for complete search history.

(56) References Cited

U.S. PATENT DOCUMENTS

| | | | |
|---|---|---|---|
| 3,009,560 A * | 11/1961 | Frazier | ....................... 198/392 |
| 5,125,789 A * | 6/1992 | Farr | ........................... 414/728 |
| 5,205,896 A | 4/1993 | Brown et al. | |
| 5,290,134 A | 3/1994 | Babba | |
| 5,667,097 A * | 9/1997 | Joyce | ........................... 221/93 |
| 5,961,168 A | 10/1999 | Kanno | |
| 6,040,585 A * | 3/2000 | Hsiao | ....................... 250/559.4 |
| 6,184,047 B1 | 2/2001 | Shekar et al. | |

* cited by examiner

*Primary Examiner*—Saúl J Rodríguez
*Assistant Examiner*—Jonathan D Snelting
(74) *Attorney, Agent, or Firm*—Hovey Williams LLP

(57) ABSTRACT

A feeding mechanism and method for feeding minute items, such as capacitors, resistors, or solder preforms. The mechanism is adapted to receive a plurality of the randomly-positioned and randomly-oriented extremely small or minute items, and to isolate, orient, and position one or more of the items in a specific repeatable pickup location wherefrom they may be removed for use by, for example, a computer-controlled automated assembly machine. The mechanism comprises a sliding shelf adapted to receive and support the items; a wiper arm adapted to achieve a single even layer of the items; and a pushing arm adapted to push the items into the pickup location. The mechanism can be adapted for providing the items with a more exact orientation, and can also be adapted for use in a liquid environment.

9 Claims, 6 Drawing Sheets

FEED MECHANISM AND METHOD FOR FEEDING MINUTE ITEMS

FEDERALLY SPONSORED RESEARCH OR DEVELOPMENT PROGRAM

The present invention was developed with support from the U.S. government under Contract No. DE-AC04-01AL66850 with the U.S. Department of Energy. Accordingly, the U.S. government has certain rights in the present invention.

BACKGROUND OF THE INVENTION

1. Field of the Invention

The present invention relates broadly to mechanisms for feeding, dispensing, delivering, or otherwise handling extremely small or minute items. More particularly, the present invention concerns a feeding mechanism adapted to receive a plurality of randomly-positioned and randomly-oriented extremely small or minute items, such as, for example, capacitors, resistors, or solder preforms, and to isolate, orient, and position one or more of the items in a specific repeatable pickup location wherefrom they may be removed for use by, for example, a computer-controlled automated assembly machine.

2. Description of the Prior Art

It is often desirable to feed, dispense, deliver, or provide extremely small or minute items to a computer-controlled automated assembly machine or other similar equipment, thereby substantially fully-automating an assembly process. In one application, for example, the minute items are surface mount electronic items and the automated assembly machine is operable to automatically incorporate and assemble these items into electronic circuitry. Typically, providing the items to the automated assembly machine is accomplished by a feeding mechanism that positions the items in a repeatable pickup location wherefrom they can thereafter be removed for use by the automated assembly machine. Several different types of feeding mechanisms exist, including, for example, tape reel feeders, waffle-style feeders, and linear or bowl-type vibratory feeders.

Prior art tape reel feeders use items which have been pre-packaged in either punched carrier tapes or embossed carrier tapes. The carrier tape is constructed from either paper or plastic and is punched or embossed to form individual pockets for each item. A flat cover tape is adhered to the carrier tape to seal the items in the pockets. In use, the tape reel feeder removes the cover tape from one of the pockets and indexes that pocket forward into the pickup location. Once the exposed item is removed from the pocket by the automated assembly machine, another pocket is uncovered and indexed forward into the pickup location.

Prior art waffle packages involve plastic trays molded into a matrix pattern to form individual pockets for each item, with a single lid covering all of the filled pockets. These packages are typically filled by the vendor. To feed these items, the package is placed on a locating fixture and the lid is removed, whereafter the assembly equipment or machine indexes each pocket in turn and removes the item therefrom.

Prior art vibratory feeders may be of either bowl, linear, or back-and-forth design, each of which uses an electromagnet and a spring to feed the items using vibration. In a bowl design, the items are fed upward along a helical vibratory bowl; in a linear design they are fed along a flat straight line; and in a back-and-forth design they are fed along an inclined straight line. A common variation of vibratory feeding uses items prepackaged in extruded aluminum stick magazines. The magazines are placed on a flat linear feeder and the items are fed forward within the magazines.

These prior art mechanisms are commonly used for feeding or dispensing small items having dimensions of greater than 0.762 mm×0.508 mm×0.1778 mm (0.030 inch×0.020 inch×0.007 inch). It is, however, much more difficult to feed minute items having dimensions of less than 0.762 mm×0.508 mm×0.1778 mm (0.030 inch×0.020 inch×0.007 inch). In prior art tape reels and waffle packages, for example, the size, size tolerance, and positional tolerance of the pockets required to locate the minute items in the repeatable pickup location while maintaining the items' orientation is difficult to achieve. The Electronic Industries Association (EIA) has promulgated Recommended Standard EIA-481-1-90 relating to the dimensions and tolerance of the carrier tape used for tape reel feeding. This standard was written for items larger than 0.762 mm×0.508 mm×0.1778 mm (0.030 inch×0.020 inch×0.007 inch), and recommends that the clearance between the item and the pocket be a minimum of 0.0508 mm (0.002 inch) and a maximum of 0.508 mm (0.020 inch), and that the angle of rotation of the item within the pocket be a maximum of 20°. Given, for example, an item that is 0.381 mm (0.015) inch square, the maximum allowable clearance between the item and the pocket to prevent a rotation greater than 20° is 0.10668 mm (0.0042 inch). For a 0.010 inch square item, the maximum allowable clearance is 0.07112 mm (0.0028 inch).

Where such exact tolerances are not practical, possible, or otherwise met, it is known to use a machine vision system to sense the orientation of the item in a loosely fitting pocket. The machine vision system must be operable to determine the orientation of the item and to compensate for the item's position and degree of rotation. Unfortunately, development and implementation of such a machine vision system is typically exceedingly expensive. Furthermore, operation of the machine vision system, particularly steps involved in processing images, adds undesirably to the total assembly time of the electronic circuit. Additionally, the machine vision system requires extensive programming as well as development of adequate lighting necessary to illuminate the item and the pocket.

Prior art vibratory feeders also suffer from substantial disadvantages and limitations. The forces acting to move the item forward are due to an acceleration of the vibratory feeder and are proportional to the mass of the item. As the item's size decreases, the forces acting to move the item become smaller than the friction, electrostatic, and other forces acting to resist the movement. Furthermore, where the item is pre-packaged in a stick magazine, the fit between the item and the stick magazine must be sufficiently tight to maintain the item in a proper orientation. Again, however, as the item's size decreases, the dimensions, surface finish, and tolerances of the track required to feed the item within the stick magazine and to maintain its proper orientation becomes increasingly difficult to achieve.

Due to the above-identified and other problems and disadvantages in the art, a need exists for an improved mechanism for feeding minute items.

SUMMARY OF THE INVENTION

The present invention overcomes the above-described and other problems and disadvantages in the prior art by providing a feeding mechanism adapted to receive a plurality of randomly-positioned and randomly-oriented extremely small or minute items, such as, for example, capacitors, resistors, or solder preforms, and to isolate, orient, and position one or more of the items in a specific repeatable pickup location wherefrom they may be removed for use by, for example, a computer-controlled automated assembly machine or other similar equipment. As described herein, the mechanism is operable to feed items at least as small as approximately 0.381 mm×0.381 mm×0.0762 mm (0.015 inch×0.015 inch×0.003 inch).

In a preferred embodiment, the mechanism broadly comprises a base; a lower mesh; a sliding shelf; first and second plates; a pushing arm; a first shim; a wiper arm; a second shim; a third shim; a fourth shim; a fifth shim; first and second guides; a cover; an upper mesh; and a fitting. The base allows for securing the mechanism to an underlying support structure. A center portion of the top of the base is provided with one or more openings for allowing air flow therethrough. The lower mesh is positioned over the openings and adapted to support and retain the items in the absence of vacuum, particularly any items not supported on the sliding shelf.

The sliding shelf is adapted to receive and support the items after vacuum is removed. The sliding shelf slides over the lower mesh so as to be selectively positionable beneath the upper mesh. The pickup location is located on a forward end of the sliding shelf. The first and second plates are adapted to guide the sliding shelf and to cooperate therewith to retain the items in a central area of the mechanism. The first and second plates rest on the lower mesh, and butt against both sides of the sliding shelf to form a channel within which sliding shelf slides.

The pushing arm is adapted to push the items into the pickup location. The pushing arm is positioned over the first plate and oriented perpendicular to the sliding shelf, and is slidable so as to selectively pass over the sliding shelf. The first shim is adapted to rest on the second plate such that the top surface of the first shim is substantially level with the top surface of the pushing arm.

The wiper arm is adapted to slide over the items supported on the sliding shelf and to knock off any items resting on or stacked on other items, thereby resulting in a single, even layer of the items. The wiper arm is positioned over the first shim and is oriented perpendicular to the sliding shelf and opposite the pushing arm. The wiper arm is slidable so as to selectively pass over both the sliding shelf and the pushing arm.

The second shim is adapted to further define the central area of the mechanism wherewithin the items are maintained. The second shim rests on the lower mesh between the first and second plates and at an extreme end of the movement path of the sliding shelf. The third shim is adapted to rest on the second shim such that the top surface of the third shim is substantially level with the top surface of the first shim. The fourth shim is adapted to rest on the first plate alongside the pushing arm such that the top surface of the fourth shim is substantially level with the top surface of the first shim which rests on the second plate. The fifth shim is adapted to rest on the first plate alongside the pushing arm such that the top surface of the fifth shim is substantially level with the top surface of the first shim. The fourth shim and the fifth shim cooperate to form a channel within which the pushing arm slides.

The first and second guides cooperate to form a channel through which both the pushing arm and the wiper arm slide. The first and second guides are located to either side of the pushing arm and the wiper arm, with the first guide extending over and across the fourth shim, the third shim, and the first shim, and the second guide extending over and across the fifth shim and the first shim.

The cover is adapted to cover the aforementioned elements and to provide a mounting mechanism for the upper mesh and the fitting. The cover is secured over the first and second guides. Four setscrews are threaded into holes in the cover located over the pushing arm and the wiper arm. These setscrews are threadably adjustable to allow for establishing and maintaining a light pressure on the pushing arm and the wiper arm. Additionally, a fitting hole is provided in the cover located substantially over the central portion of the mechanism wherein the items are located and retained. The upper mesh and a rubber O-ring are positioned in the fitting hole. The upper mesh is substantially similar to the lower mesh, and is adapted to prevent the items from leaving the central area of the mechanism when the vacuum is applied.

The fitting is adapted to connect to a vacuum generating mechanism and to allow for selectively applying the vacuum to the mechanism. The fitting is threaded into the fitting hole over the small circular mesh and the rubber O-ring.

In order to ease assembly of the aforementioned elements, four large holes are provided in the first and second guides and in the fourth and fifth shims to allow for assembling the mechanism in stages. These holes facilitate easier assembly by eliminating any requirement that all of the various items of the mechanism be correctly positioned before any can be secured. These holes fit over the heads of four temporary sockethead capscrews which are later replaced with more permanent capscrews.

The slidable or otherwise movable elements of the mechanism may be driven either by one or more air cylinders responding to solenoid valves which are, in turn, controlled by a programmable logic controller, or by three cams on a single rotating shaft, with the shaft being located in the base of the mechanism.

Where a item to be fed requires a particularly exact orientation, then technology for achieving this is readily incorporated into the mechanism. Because normal operation of the mechanism will impart a fairly exact orientation to the item, the additional orientation technology need not be as sophisticated, complex, or expensive embodiment of the mechanism, for example, a laser reflective photoelectric sensor is used to detect the item's orientation. If the item is detected to be in an insufficiently precise orientation, then the mechanism is made to repeat the feeding cycle until a item is fed into position with the desired orientation.

Although described as operating in air, the mechanism of the present invention is readily adaptable to operation in fluid. Rather than being drawn against the upper mesh by vacuum, a small pump or agitation device can be used to move the liquid through the upper mesh and cause the items to be drawn thereagainst. Alternatively, the upper and lower meshes may be eliminated altogether and replaced with an internal pump or agitator adapted to stir or agitate the items such that some or all come to rest on the sliding shelf. This liquid-environment embodiment is useful, for example, where the minute items are created by a LiGA process involving plating the items, releasing them into an etching fluid, and then moving them into a rinsing fluid. In the prior art, the items would then need be laboriously removed by hand from the rinsing fluid using tweezers. Using the mechanism of the present invention, however, the items can be efficiently and automatically retrieved from the rinsing fluid without damage.

Thus, it will be appreciated that the mechanism of the present invention provides a number of substantial advantages over the prior art, including, for example, allowing for the feeding of items too small to be fed by prior art feeding mechanisms. Furthermore, the mechanism advantageously achieves more accurate and consistent placement of the items in the pickup location. Thus, the mechanism allows the items to be efficiently fed from a bulk supply. Additionally, the mechanism advantageously maintains the items in a sealed environment rather than exposing the items to ambient air as is done when feeding items from prior art waffle packages. Additionally, the mechanism can be equipped with a simple laser sensor for orienting the items, rather than the sophisticated, complex, and expensive machine vision technology used by prior art feeding mechanisms. Additionally, the mechanism is readily adaptable for use in liquid environments such as, for example, might be encountered when manufacturing the items using the LiGA process.

These and other important features of the present invention are more fully described in the section titled DETAILED DESCRIPTION OF A PREFERRED EMBODIMENT, below.

BRIEF DESCRIPTION OF THE DRAWINGS

A preferred embodiment of the present invention is described in detail below with reference to the attached drawing figures, wherein.

DETAILED DESCRIPTION OF A PREFERRED EMBODIMENT

Figure 1:
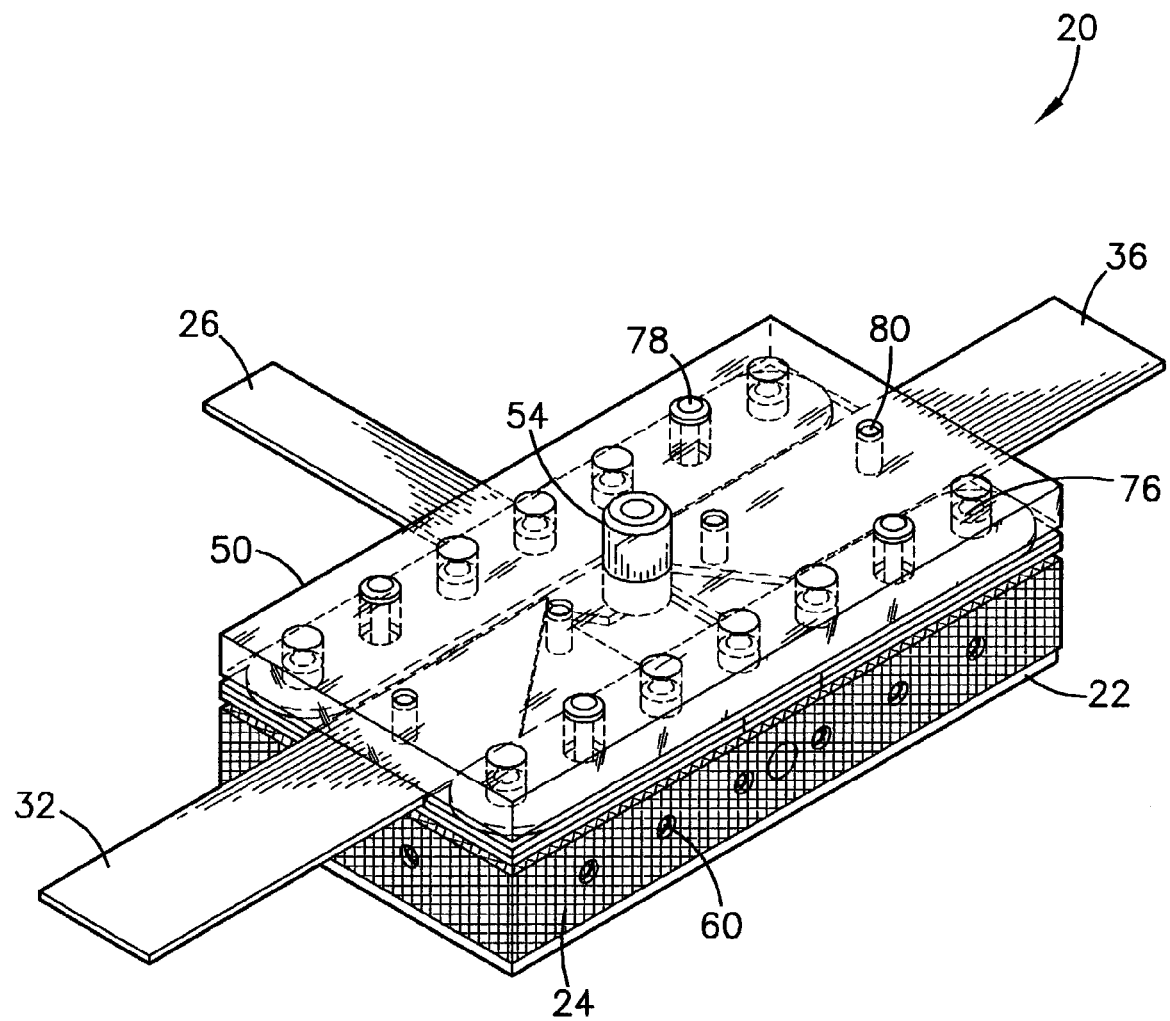
FIG. 1 is an isometric view of a preferred embodiment of the sliding feed mechanism of the present invention.
Figure 2:
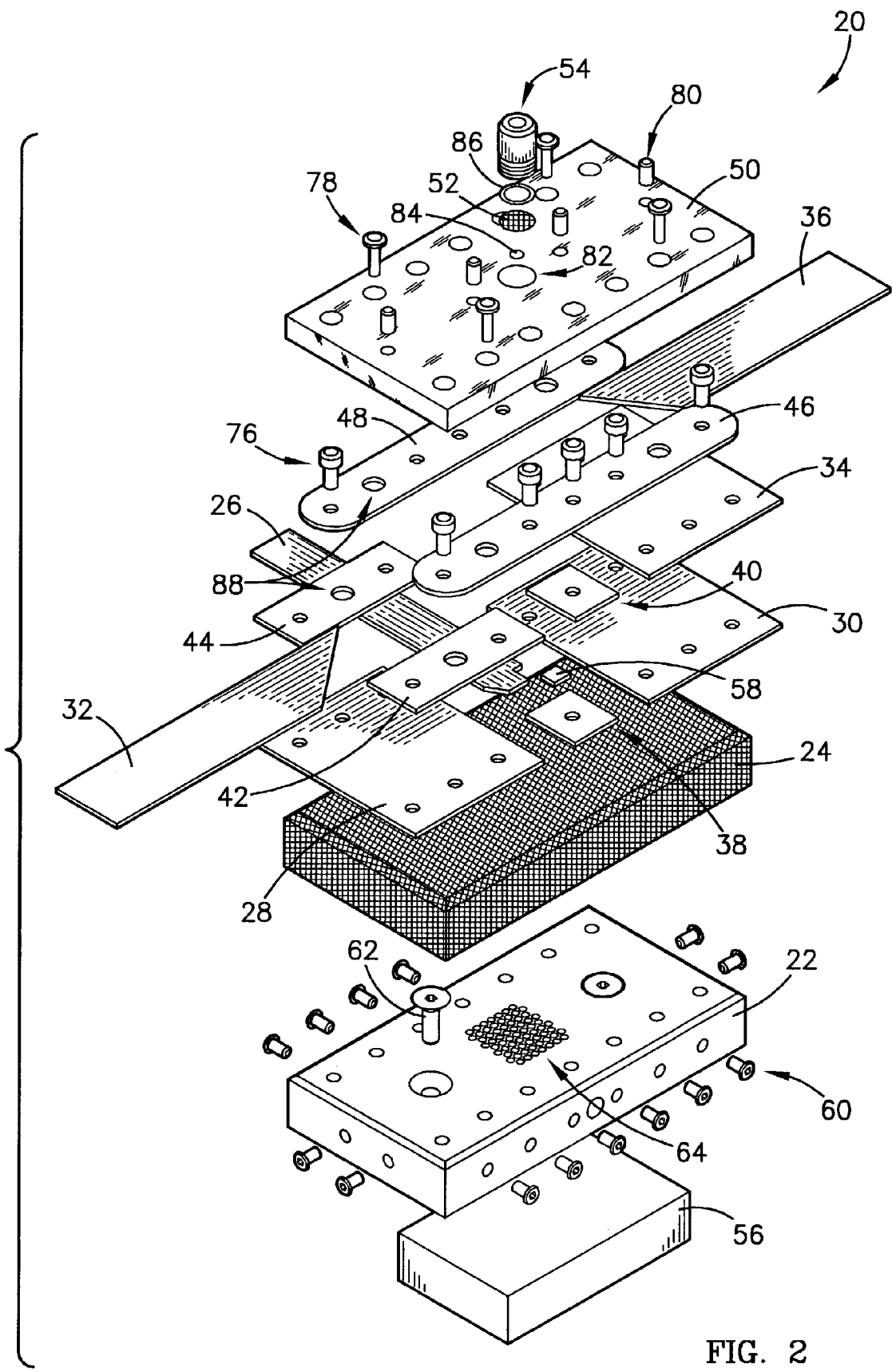
FIG. 2 is an exploded isometric view of the sliding feed mechanism of FIG. 1.
Figure 3:
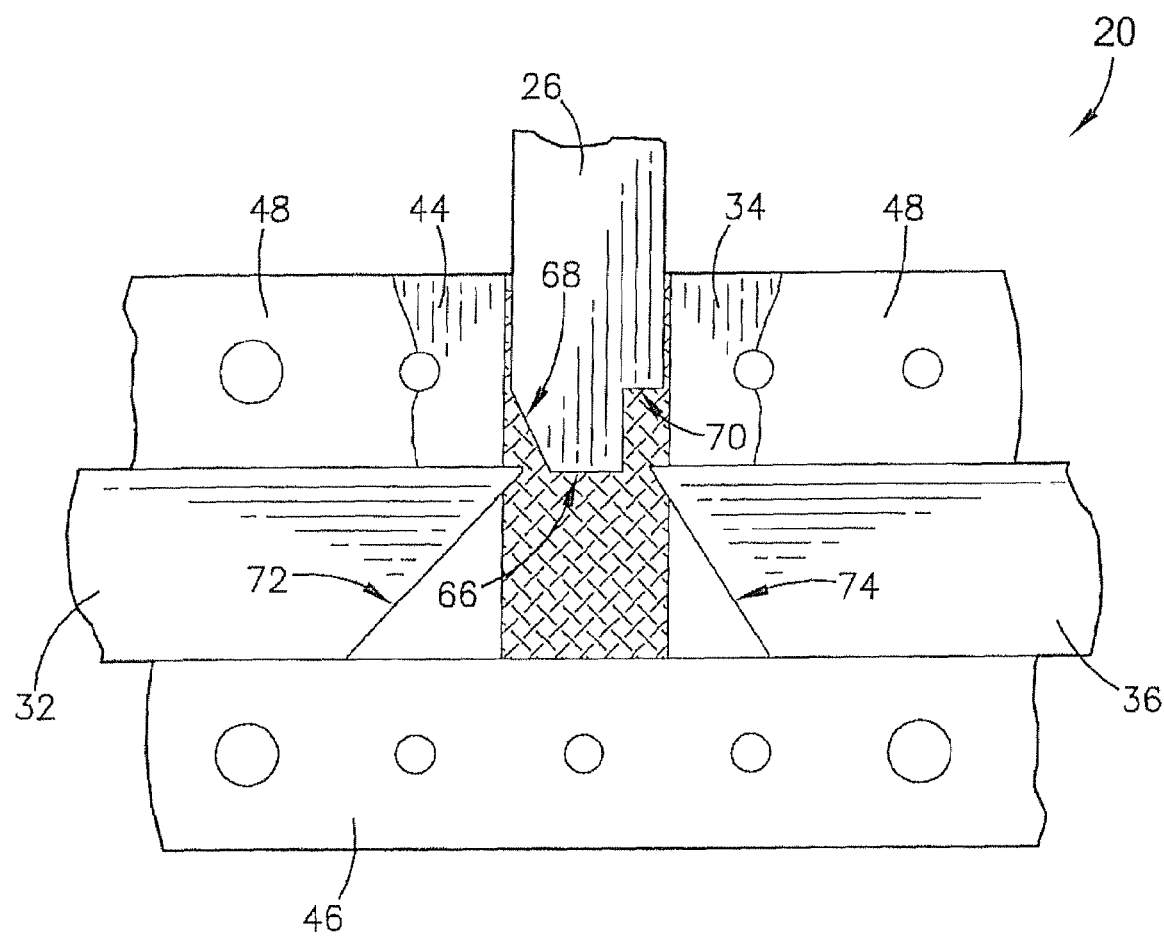
FIG. 3 is a fragmentary cut-away plan view of certain movable elements of the sliding feed mechanism of FIG. 1.

Referring to FIGS. 1-3, a sliding feed mechanism 20 is shown constructed in accordance with a preferred embodiment of the present invention. The mechanism 20 is adapted to receive a plurality of randomly-positioned and randomly-oriented extremely small or minute items, such as, for example, capacitors, resistors, or solder preforms, and to isolate, orient, and position one or more of the items in a specific repeatable pickup location wherefrom they may be removed for use by, for example, a computer-controlled automated assembly machine or other similar equipment.

As described herein, the mechanism 20 is operable to feed items at least as small as approximately 0.381 mm×0.381 mm×0.0762 mm (0.015 inch×0.015 inch×0.003 inch). The items may be, for example, minute electronic items, such as capacitors or resistors, or minute mechanical items. It will be appreciated, however, that the mechanism 20 of the present invention is substantially independent of the characteristics or nature of the items. Furthermore, the mechanism 20 uses vacuum, air agitation, liquid agitation, or other appropriate means to initially move the items within the mechanism 20.

In a preferred embodiment adapted for feeding the aforementioned minute items, the mechanism 20 broadly comprises a base 22; a lower mesh 24; a sliding shelf 26; first and second plates 28,30; a pushing arm 32; a first shim 34; a wiper arm/cover device 36; a second shim 38; a third shim 40; a fourth shim 42; a fifth shim 44; first and second guides 46,48; a cover 50; an upper mesh 52; and a fitting 54.

The base 22 allows for securing the mechanism 20 to an underlying support structure. The base 22 is substantially rectangular in shape, presenting four vertical surfaces and a top, and is constructed from machined steel. A plurality of smaller holes are provided in the four vertical surfaces and in the top, and two larger holes are also provided in the top. The plurality of smaller holes provided in the four vertical surfaces are adapted to receive sixteen buttonhead-type capscrews 60 to secure the lower mesh 24 to the base 22. The two larger holes provided in the top are adapted to receive two flathead-type capscrews 62 to secure the base 22 to the underlying support structure. A center portion of the top of the base 22 is provided with one or more openings 64 for allowing air flow therethrough.

The lower mesh 24 is adapted to support and retain the items in the absence of the vacuum. The lower mesh 24 is substantially rectangular in shape, presenting four vertical sides, and is constructed from an extremely fine stainless steel mesh material. The lower mesh 24 is positioned over the openings 64 in the top of the base 22 and is stretched over the top of the base 22 so that the vertical sides of the lower mesh 24 are in close adjacent proximity to the vertical sides of the base 22. As mentioned, the sixteen buttonhead-type capscrews secure the vertical sides of the lower mesh 24 to the vertical sides of the base 22.

The sliding shelf 26 is adapted to slidably receive and support the items once the vacuum is removed. The sliding shelf 26 is substantially rectangular in shape, presenting a forward end 66, and is constructed from sixteen gauge steel sheet. The sliding shelf 26 slides over the lower mesh 24 so as to be selectively positionable beneath the upper mesh 52. The forward end 66 of the sliding shelf 26 presents a beveled corner 68, a substantially rectangular notch 70, and the pickup location (best seen in FIG. 10).

The pushing arm 32 is adapted to push the items into the pickup location. The pushing arm 32 is substantially rectangular in shape with an angled forward end 72, and is constructed from 0.127 mm (0.005 inch) thick stainless steel feeler stock. The pushing arm 32 is positioned over the first plate 28 and oriented perpendicular to the sliding shelf 26, and is slidable so as to selectively pass over the sliding shelf 26.

The first shim 34 is positioned on the second plate 30 such that the top surface of the first shim 34 is substantially level with the top surface of the pushing arm 32. Thus, the first shim 34 is of substantially the same thickness as the pushing arm 32, 0.127 mm (0.005 inch), and is constructed of brass or stainless steel.

The wiper arm 36 is adapted to slide over the items supported on the sliding shelf 26 and to knock off any items resting on or stacked on other items, thereby resulting in a single even layer of the items. The wiper arm 36 is substantially rectangular in shape with an angled forward end 74, and is constructed from 0.381 mm (0.015 inch) thick stainless steel feeler stock. The wiper arm 36 is positioned over the first shim 34 and is oriented perpendicular to the sliding shelf 26 and opposite the pushing arm 32. The wiper arm 36 is slidable so as to selectively pass over both the sliding shelf 26 and the pushing arm 32.

The second shim 38 is adapted to further define the central area of the mechanism wherewithin the items are maintained. The second shim 38 is substantially square in shape, measuring approximately 12.7 mm (0.500 inch) square and 0.127 mm (0.005 inch) thick, and is constructed from stainless steel feeler stock. The second shim 38 is positioned over the lower mesh 24 and between the first and second plates 28,30 and at an extreme end of the movement path of the sliding shelf 26.

The third shim 40 is positioned on the second shim 38 such that the top surface of the third shim 40 is substantially level with the top surface of the first shim 34. Thus, the third shim 40 is also substantially square in shape, measuring 12.7 mm (0.50 inch) square, but is constructed from sixteen gauge stainless steel sheet to achieve the required thickness.

The fourth shim 42 is positioned over the first plate 28 alongside the pushing arm 32 such that the top surface of the fourth shim 42 is substantially level with the top surface of the first shim 34. The fourth shim 42 is substantially rectangular in shape, measuring approximately 38.1 mm (1.50 inch) by 12.7 mm (0.50 inch) by 0.127 mm (0.005 inch) inch thick, and is constructed from stainless steel feeler stock.

The fifth shim 44 is positioned over the first plate 28 and alongside the pushing arm 32 such that the top surface of the fifth shim 44 is substantially level with the top surface of the first shim 34. The fourth shim 42 and the fifth shim 44 cooperate to form a channel within which the pushing arm 32 slides. The fifth shim 44 is substantially rectangular in shape, measuring approximately 38.1 mm (1.50 inch) by 12.7 mm (0.50 inch) by 0.381 mm (0.015 inch) inch thick, and is constructed from stainless steel feeler stock.

The first and second guides 46,48 cooperate to form a channel through which the pushing arm 32 and the wiper arm 36 slide. The first and second guides 46,48 are both substantially rectangular in shape and are constructed from stainless steel feeler stock. The first and second guides 46,48 are, however, of different thicknesses, with the first guide 46 being approximately 0.381 mm (0.015 inch) thick, and the second guide 48 being approximately 0.508 mm (0.020 inch) thick. The first and second guides 46,48 are located to either side of the pushing arm 32 and the wiper arm 36, with the first guide 46 extending over and across the fourth shim 42, the third shim 40, and the first shim 34, and the second guide 48 extending over and across the fifth shim 44 and the first shim 34.

The first and second guides 46,48 present a plurality of holes which align with holes in the various shims 34,38,40, 42,44 and with holes in the first and second plates 28,30 and with the holes in the top surface of the base 22. Nine sockethead-type capscrews 76 are received within these aligned holes to thereby secure and bind all of these elements together. The cover 50 is adapted to cover the aforementioned elements and to provide a mounting mechanism for the fitting 54. The cover 50 substantially rectangular in shape and of approximately the same length and width as the base 22, and is constructed from plexiglass or another similarly suitable material. The cover 50 is placed over the first and second guides 46,48 and secured with four flathead-type capscrews 78 which are received within four holes presented in the cover 50. These four capscrews 78 extend through holes presented in the various shims 34,38,40,43,44 and through holes in the first and second plates 28,30 to be received within holes in the top surface of the base 22. The tapered heads of these four capscrews 78 operate to automatically center the cover 50. Furthermore, four setscrews 80 are threaded into holes in the cover 50 located over the pushing arm 32 and the wiper arm 36. These setscrews 80 are threadably adjustable to allow for establishing and maintaining a light pressure on the pushing arm 32 and the wiper arm 36. Additionally, an access hole 84 is provided in the cover 50 directly above the pickup location for accessing and removing the item from the pickup location. Additionally, a fitting hole 82 is provided in the cover 50 located substantially over the central portion of the mechanism 20 wherein the items are initially located and retained.

The upper mesh 52 is substantially similar to the lower mesh 24, and is adapted to prevent the items from leaving the central area of the mechanism 20 due to the applied vacuum. The upper mesh 52, being constructed from the same fine stainless steel mesh as the lower mesh 24, and a rubber O-ring 86 are positioned in the fitting hole 82.

The fitting 54 is adapted to connect to a vacuum-generating mechanism and to allow for selectively apply the vacuum to the mechanism 20. The fitting 54 is a substantially conventional brass fitting, such as is commonly available from a variety of suppliers. The fitting 54 is threaded into the fitting hole 82 over the upper mesh 52 and the rubber O-ring 86.

Although described in detail herein as using a selectively applied vacuum to move the items, the mechanism 20 is, as mentioned, readily adaptable to instead use an agitation of air to move the items. In this case, the fitting 54 is adapted to connect to a source of air and to selectively apply the air to the mechanism 20. This "agitated air" embodiment may operate substantially similar to an "agitated liquid" embodiment described below wherein the mechanism 20 is adapted to operate in a liquid environment.

In order to ease assembly of the aforementioned elements, four large holes 88 are presented in the first and second guides 46,48 and in the fourth and fifth shims 42,44 to allow for assembling the mechanism 20 in stages. These holes 88 facilitate easier assembly by eliminating any requirement that all of the various elements of the mechanism 20 be correctly positioned before any can be secured. These holes 88 fit over the heads of four temporary sockethead capscrews (not shown) which are similar to the nine sockethead capscrews 76 used in the final assembly. Thus, during assembly, after the fourth shim 42 and the first and second guides 46,48 are secured with the nine sockethead capscrews 76, the four temporary sockethead capscrews are removed and, thereafter, replaced with the four flathead capscrews 78 used to secure the cover 50 in place.

It will be appreciated that the slidable or otherwise movable items of the mechanism 20 require a drive mechanism 56. In one embodiment, the drive mechanism 56 includes one or more air cylinders responding to solenoid valves which are, in turn, controlled by a programmable logic controller. In an alternative embodiment, the drive mechanism 56 includes three cams on one or more rotating shafts, with the shafts being located in the base 22 of the mechanism 20. Such a camshaft-type arrangement is simpler, smaller, and provides smoother operation than the air cylinder-type arrangement, and eliminates the programmable logic controller. It will be appreciated that any of a variety of alternative drive mechanisms may be used.

Figure 4:
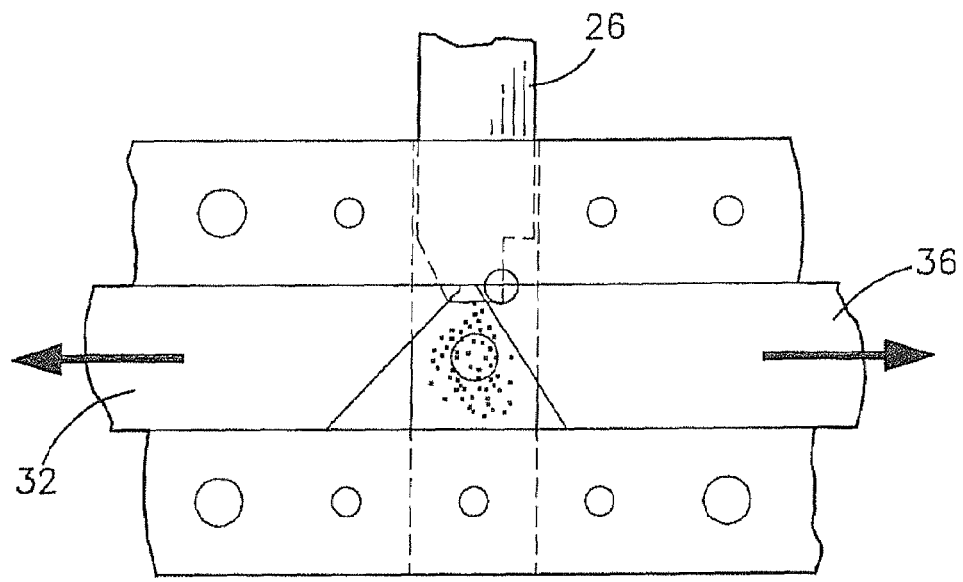
FIG. 4 is an illustrative depiction of the performance of a preferred first step of the method of the present invention.

In exemplary use and operation, referring to FIGS. 4-10, the mechanism 20 is used with an existing automated assembly machine to feed the minute items thereto, thereby substantially fully-automating the assembly process. The mechanism 20 is initialized for use by sliding back the sliding shelf 26, the pushing arm 32, and the wiper arm 36, thereby exposing the central area of the mechanism 20 directly over the air flow openings 64 in the top surface of the base 22, as shown in FIG. 4. A plurality of the items are then randomly placed within this central area.

Figure 5:
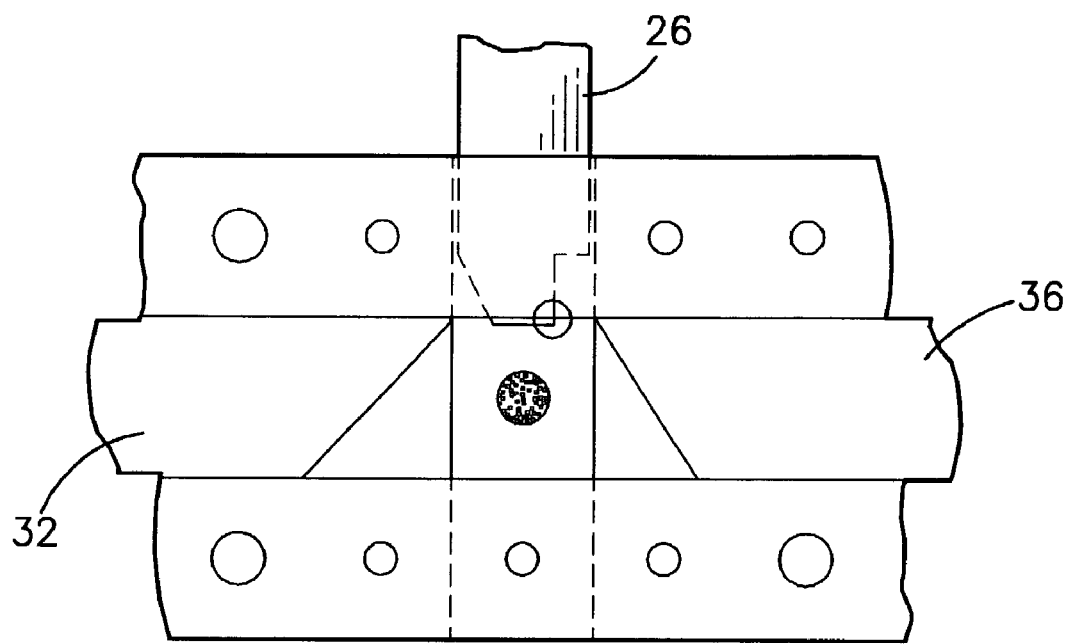
FIG. 5 is an illustrative depiction of the performance of a preferred second step of the method.
Figure 6:
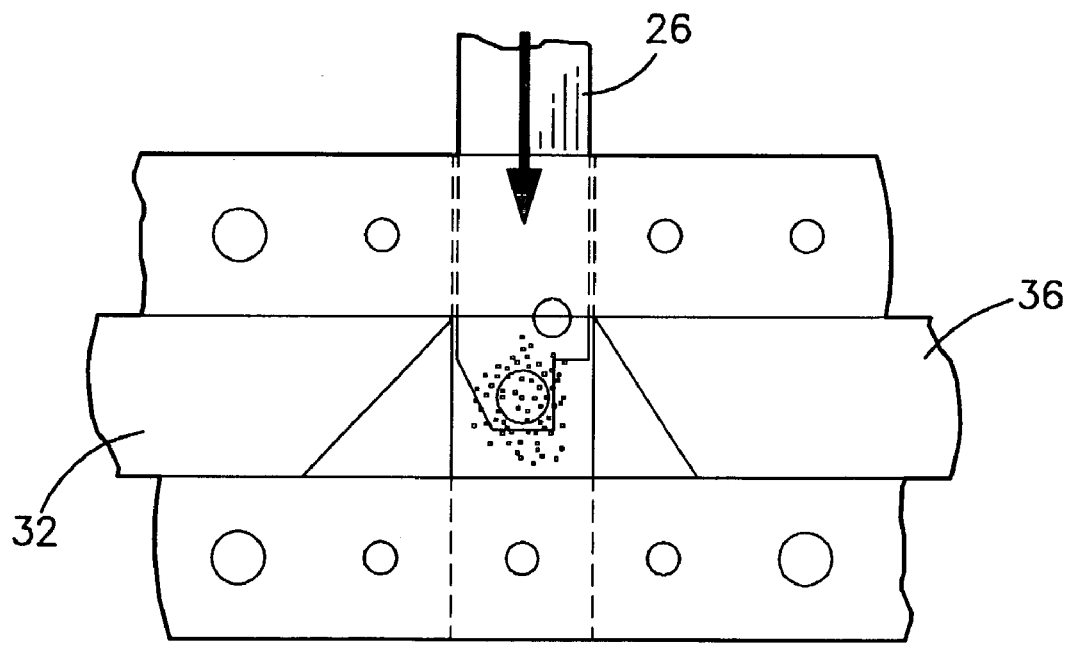
FIG. 6 is an illustrative depiction of the performance of a preferred third step of the method.

The vacuum is then applied and some or all of the items are drawn against the upper mesh 52, as shown in FIG. 5. The sliding shelf 26 is moved under the upper mesh 52 and the vacuum is removed to allow the items to drop onto the forward portion 66 of the sliding shelf 26, as shown in FIG. 6.

Figure 7:
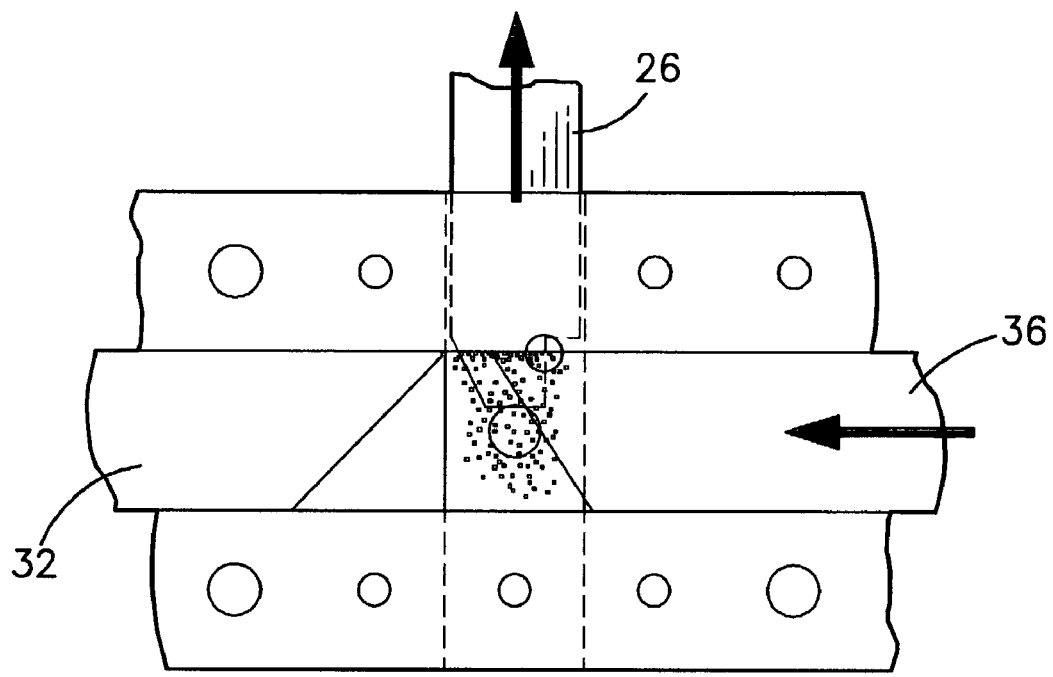
FIG. 7 is an illustrative depiction of the performance of a preferred fourth step of the method.

The sliding shelf 26 is then drawn back as the wiper arm 36 is moved into place, as shown in FIG. 7. As the wiper arm 36 moves over the items on the sliding shelf 26, any item stacked on another item, or otherwise exceeding or projecting above a certain height is knocked off or over to result in a substantially level and even layer of the items on the sliding shelf 26. The sliding shelf 26 is then drawn back to just short of its final position.

Figure 8:
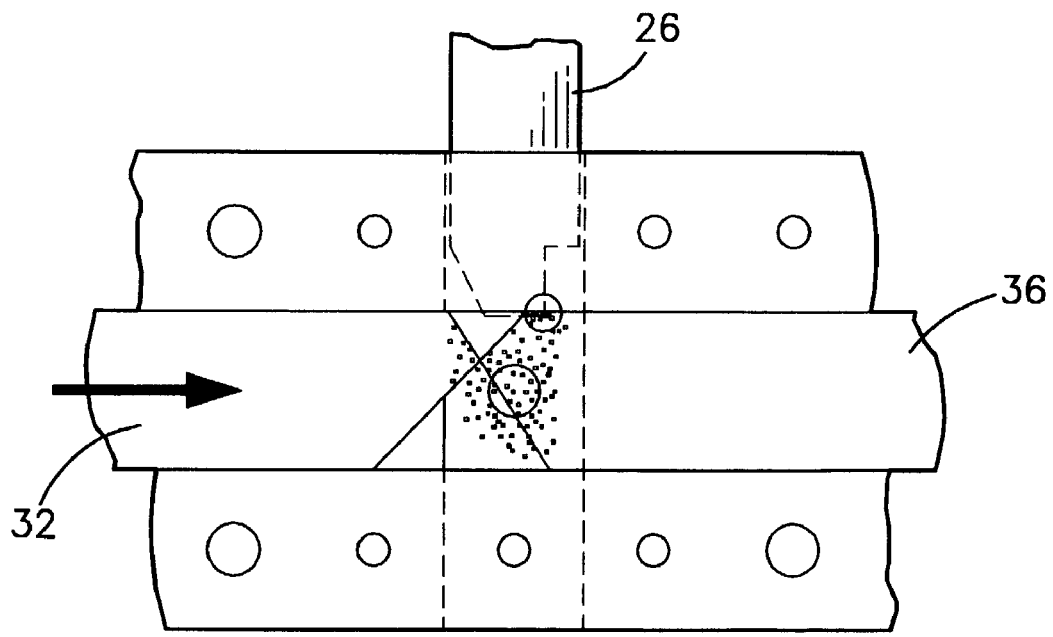
FIG. 8 is an illustrative depiction of the performance of a preferred fifth step of the method.
Figure 9:
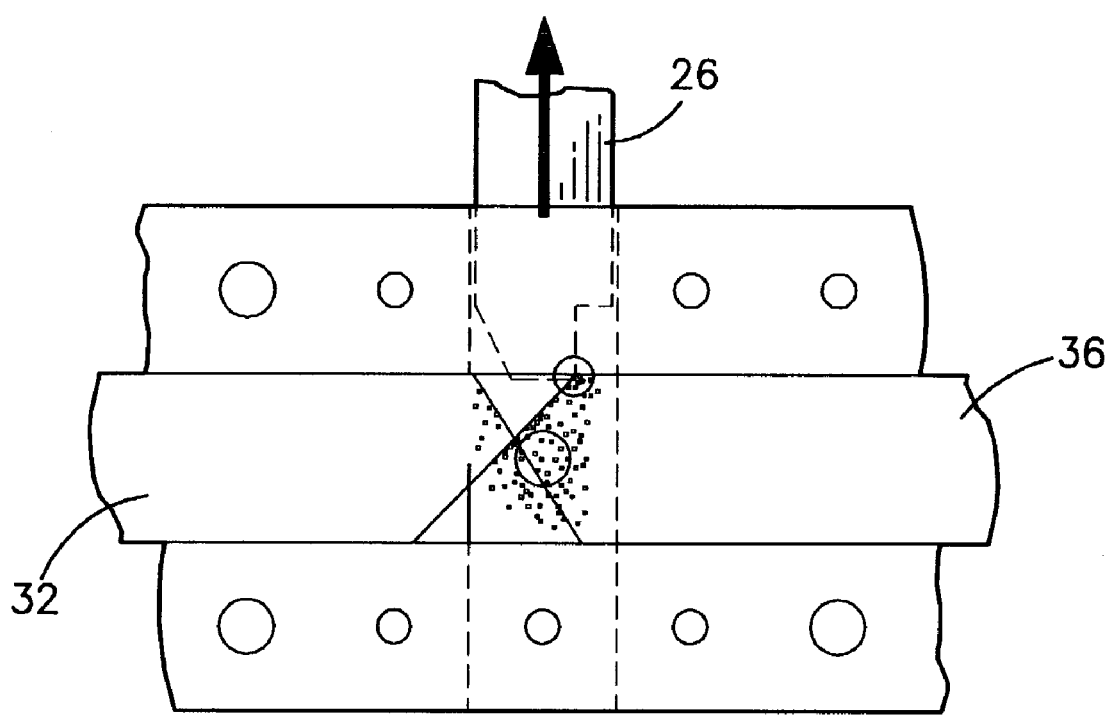
FIG. 9 is an illustrative depiction of the performance of a preferred sixth step of the method, wherein a minute item is positioned in a pickup location.
Figure 10:
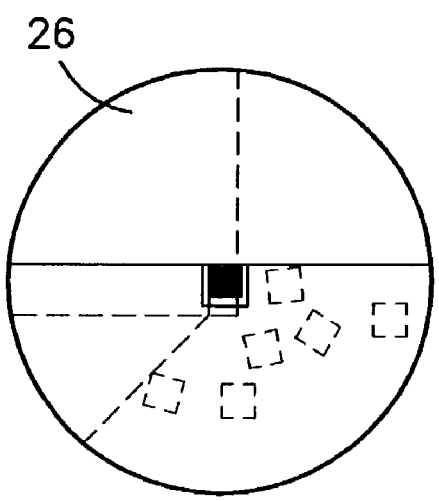
FIG. 10 is an enlarged view of the minute item positioned in the pickup location shown in FIG. 9.

Next, the pushing arm 32 pushes the items forward and positions one of the items directly in the pickup location, as shown in FIG. 8. The sliding shelf 26 is then pulled back to its final position, thereby squaring the item within the pickup location, as shown in FIGS. 9 and 10. Thereafter, the automated assembly machine will remove the item as needed.

It will be appreciated that certain types of minute items, such as, for example, single layer capacitors and solder preforms, do not require that the mechanism 20 perform additional steps to orient them. Where a item to be fed requires a particularly exact orientation, however, technology for achieving such is readily incorporated into the mechanism 20. Because normal operation of the mechanism 20 will impart an accurate orientation to the item (see the discussion of FIGS. 9 and 10, above), the additional orientation technology need not be as sophisticated, complex, or expensive as the machine vision used with loose fitting prior art waffle packages. In one embodiment, for example, a laser reflective photoelectric sensor 58, such as is available, for example, as model LZ-51 from Keyence Corporation of America, could be used to detect the item's orientation. If the item is detected to be in an improper orientation, the mechanism 20 is made to repeat its feeding cycle until a item is fed into position with the proper orientation. The laser sensor 58 can be secured to the mechanism 20 or to the automated assembly machine. Securing the laser sensor 58 to the mechanism 20 provides the advantage of allowing it to work independently of the automated assembly machine and facilitates ensuring that a correctly-oriented item is in position prior to it being needed by the automated assembly machine. Securing the laser sensor 58 to the automated assembly machine would reduce costs because only one laser sensor 58 is needed rather than one for each mechanism 20, but may increase assembly times because the automated assembly machine may potentially have to wait until the mechanism 20 works through multiple feeding cycles until a correctly-oriented item is fed into position.

It will also be appreciated that, although described as operating in air, the mechanism 20 of the present invention is readily adaptable to operation in a liquid environment, as mentioned above. Rather than being drawn against the upper mesh 52 by the vacuum, a small pump or agitation device can be connected to the fitting 54 and used to move the liquid through the upper mesh 52 and cause the items to be drawn thereagainst. Alternatively, the upper and lower meshes may be eliminated altogether and replaced with an internal pump or agitator adapted to stir or agitate the items such that some or all come to rest on the sliding shelf 26. This liquid-environment embodiment is useful, for example, where the minute items are created by a LiGA process involving plating the items, releasing them into an etching fluid, and then moving them into a rinsing fluid. In the prior art, the items would then need be laboriously removed by hand from the rinsing fluid using tweezers. Using the mechanism 20 of the present invention, however, the items can be efficiently and automatically retrieved from the rinsing fluid without damage.

From the preceding description, it will be appreciated that the mechanism 20 of the present invention provides a number of substantial advantages over the prior art, including, for example, allowing for the feeding of items too small to be fed by prior art feeding mechanisms. Furthermore, the mechanism 20 advantageously achieves more accurate and consistent placement of the items into the pickup location. Thus, the mechanism 20 allows the items to be efficiently fed from a bulk supply. Additionally, the mechanism 20 advantageously maintains the items in a sealed environment, rather than exposing the items to ambient air, as is done when feeding items from prior art waffle packages. Additionally, the mechanism 20 uses a simple laser sensor 58 for orienting the items, rather than the sophisticated, complex, and expensive machine vision technology used by prior art feeding mechanisms. Additionally, the mechanism 20 is readily adaptable for use in liquid environments such as might be encountered, for example, when manufacturing the items using a LiGA process.

Although the invention has been described with reference to the preferred embodiments illustrated in the drawings, it is noted that equivalents may be employed and substitutions made herein without departing from the scope of the invention as recited in the claims. For example, it will be appreciated that the mechanism 20 is readily adaptable for use in feeding items of various sizes by changing the thicknesses of the sheet metal, the feeler stock, or the shims 34,38,40,43,44 and by changing the size of the pickup location at the forward end 66 of the sliding shelf 26. Furthermore, although the various shims 34,38,40,43,44 allow for greater flexibility, particularly with regard to accommodating different-sized items, the shims or plates could be eliminated by combining their geometries into machined features, thereby reducing overall complexity of the mechanism 20. Additionally, the overall size of the mechanism 20 described herein is dictated to some extent by the use of standard 12.7 mm (0.50 inch) wide stainless steel feeler stock, and could be increased or decreased, as desired, by using stock or other material of a different size.

The invention claimed is:

1. A mechanism for positioning one or more items in a desired location, the mechanism comprising:
   a sliding shelf adapted to receive and support the one or more items;
   a wiper arm adapted to move closely over the one or more items while the one or more items are supported on the sliding shelf, thereby achieving a single layer of the one or more items;
   a pushing arm adapted to move over the sliding shelf to push the one or more items into the desired location;
   a vacuum fitting adapted to allow for selectively applying a vacuum to move the one or more items relative to the sliding shelf, whereafter the vacuum is removed and the one or more items fall onto the sliding shelf;
   a lower mesh positioned below the sliding shelf and whereupon the one or more items are located prior to application of the vacuum; and
   an upper mesh positioned above the sliding shelf and adapted to prevent the one or more items from leaving the mechanism when the vacuum is applied.

2. The mechanism as set forth in claim 1, wherein the one or more items are each approximately "0.381 mm×0.381 mm×0.0762 mm (0.015 inch×0.015 inch×0.003 inch)" in size or smaller.

3. The mechanism as set forth in claim 1, further including a drive mechanism for moving the sliding shelf, the wiper arm, and the pushing arm.

4. The mechanism as set forth in claim 1, further including a laser sensor adapted to facilitate determining a physical orientation of the one or more items in the desired location.

5. A mechanism for isolating, orienting, and positioning a single item of a plurality of items in a desired item location, the mechanism comprising:
- a base adapted to secure the mechanism to a support structure, with the base presenting one or more openings;
- a lower mesh positioned over the one or more openings and adapted to prevent the plurality of items from entering the one or more openings;
- a sliding shelf adapted to slidably receive and support the plurality of items;
- first and second plates butted against either side of the sliding shelf and adapted to guide the sliding shelf and to cooperate therewith to retain the plurality of items on the sliding shelf;
- a wiper arm adapted to move closely over the plurality of items supported on the sliding shelf, thereby achieving a single layer of the plurality of items;
- a pushing arm adapted to move over the sliding shelf and into the plurality of items to push the single item into the desired item location;
- first and second guides butted against either side of both the wiper arm and the pushing arm and adapted to cooperate to form a channel through which the pushing arm and the wiper arm move;
- a cover positioned over the first and second guides and the wiper arm and the pushing arm and presenting a fitting hole, with the cover including one or more threaded set screws adapted to exert and adjustable pressure on both the wiper arm and the pusher arm, and the cover also including an access hole positioned directly over the desired item location and allowing for accessing and removing the single item from the desired item location;
- an upper mesh positioned within the fitting hole and adapted to prevent the plurality of items from entering the fitting hole; and
- a fitting positioned in the fitting hole behind the upper mesh, wherein the fitting is connectable to a source for selectively causing movement of the plurality of items.

6. The mechanism as set forth in claim 5, wherein the one or more items are each approximately 0.381 mm×0.381 mm×0.0762 mm (0.015 inch×0.015 inch×0.003 inch) in size or smaller.

7. The mechanism as set forth in claim 5, wherein the fitting is a vacuum fitting and the source is a vacuum source.

8. The mechanism as set forth in claim 5, further including a drive mechanism for moving the sliding shelf, the wiper arm, and the pushing arm.

9. The mechanism as set forth in claim 5, further including a laser sensor adapted to facilitate determining a physical orientation of the single items in the desired position.

\* \* \* \* \*